United States Patent [19]
Dolbear et al.

[11] Patent Number: 5,170,930
[45] Date of Patent: * Dec. 15, 1992

[54] LIQUID METAL PASTE FOR THERMAL AND ELECTRICAL CONNECTIONS

[75] Inventors: Thomas P. Dolbear; Colin A. Mackay; Richard D. Nelson, all of Austin, Tex.

[73] Assignee: Microelectronics and Computer Technology Corporation, Austin, Tex.

[*] Notice: The portion of the term of this patent subsequent to Oct. 15, 2008 has been disclaimed.

[21] Appl. No.: 791,706

[22] Filed: Nov. 14, 1991

[51] Int. Cl.$^5$ .......................................... B23K 31/02
[52] U.S. Cl. ................................ 228/123; 228/248; 228/208; 228/180.2; 439/178; 257/724
[58] Field of Search ................ 228/123, 180.2, 115, 228/248, 214, 238, 239, 179, 263.12, 208, 209; 29/599, 841; 439/179, 178, 201, 199; 357/75, 81

[56] References Cited

U.S. PATENT DOCUMENTS

| | | | |
|---|---|---|---|
| 3,141,238 | 7/1964 | Herman, Jr. | 228/248 |
| 3,372,310 | 3/1968 | Kantor | 357/75 |
| 3,395,443 | 8/1968 | Polinko, Jr. | 228/208 |
| 3,805,123 | 4/1974 | Rieger | 357/75 |
| 4,098,452 | 7/1978 | Webster et al. | 228/209 |
| 4,299,715 | 11/1981 | Whitfield et al. | 252/74 |
| 4,398,975 | 8/1983 | Ohsawa et al. | 148/400 |
| 4,403,410 | 9/1983 | Robinson | 29/830 |
| 4,410,457 | 10/1983 | Fujimura et al. | 252/508 |
| 4,435,611 | 3/1984 | Ohsawa et al. | 174/68.5 |
| 4,442,966 | 4/1984 | Jourdain et al. | 228/123 |
| 4,448,240 | 5/1984 | Sharon | 165/80 |
| 4,515,304 | 5/1985 | Berger | 228/136 |
| 4,604,644 | 8/1986 | Beckham et al. | 357/80 |
| 4,611,745 | 9/1986 | Nakahashi et al. | 228/123 |
| 4,732,702 | 3/1988 | Yamazaki et al. | 252/512 |
| 4,740,252 | 4/1988 | Hasegawa et al. | 148/24 |
| 4,740,830 | 4/1988 | Ketley | 357/67 |
| 4,769,525 | 9/1988 | Leatham | 228/123 |
| 4,769,690 | 9/1988 | Suzuki et al. | 357/67 |
| 4,796,157 | 1/1989 | Ostrem | 357/81 |
| 4,804,132 | 2/1989 | DiFrancesco | 228/208 |
| 4,875,617 | 10/1989 | Citowsky | 228/123 |
| 4,929,597 | 5/1990 | Takeshita et al. | 29/599 |
| 4,949,220 | 8/1990 | Tashiro | 357/81 |
| 4,995,546 | 2/1991 | Regnault | 228/208 |
| 5,056,706 | 10/1991 | Dolbear et al. | 228/180.2 |

OTHER PUBLICATIONS

"IBM Technical Disclosure Bulletin" vol. 31, No. 5, Oct. 1988, p. 34.
Hansen, *Constitution of Binary Alloys*, McGraw-Hill, p. 22 (1958).
Hansen, *Constitution of Binary Alloys*, McGraw-Hill, p. 96 (1958).
Keeler, "Liquid Interconnects for Fine Pitch Assembly," *Electronic Packaging & Production*, vol. 14 (Jun. 1989).
Glushkova et al, "Gallium-Copper and Gallium-Nickel Paste Solders," *Svar. Proiz.*, No. 11, pp. 26–27 (1968).
Tikhomirova, et al., "Soldering Copper with Copper-Gallium Solders," *Svar. Proiz.*, No. 10, pp. 16–18 (1967).
Harman, "Hard Gallium Alloys for Use as Low Contact Resistance Electrodes and for Bonding Thermocouples into Samples," *The Review of Scientific Instruments*, vol. 31, No. 7, pp. 717–720 (Jul., 1960).
Tikhomirova, et al., "Effect of the Particle Shape and Size of a Second Component on the Properties of the (List continued on next page.)

Primary Examiner—Richard K. Seidel
Assistant Examiner—Chuck Y. Mah
Attorney, Agent, or Firm—David M. Sigmond

[57] ABSTRACT

A thermally and electrically conductive paste for making a detachable and compliant connection between two surfaces. The paste comprises an equilibrium mixture of an electrically conductive liquid metal and particulate solid constituents, wherein at the temperature of the paste during connection the proportions of liquid metal and particulate solid constituents remain between the ultimate liquidus and the ultimate solidus of the phase diagram of the mixture and the paste remains non-solidified. in cryogenic and low temperature environments the paste forms a hardened bond with a TCE matched to a contacted surface.

58 Claims, 5 Drawing Sheets

OTHER PUBLICATIONS

Gallium Solders," *Poroshkovaya Metallurgiya*, No. 12(84), pp. 51–56 (Dec., 1969).

Darveaux et al., "Thermal/Stress Analysis of a Multichip Package Design," Proceedings of the 39th Electronic Components Conference, 1989, pp. 668–671.

Nayak et al, "A High Performance Thermal Module for Computer Packaging," *Journal of Electronic Materials, vol. 16, No. 5, pp. 357–364*.

Hwang et al, "A Thermal Module Design for Advanced Packaging," *Journal of Electronic Materials*, vol. 16, No. 5, 1987, pp. 347–355.

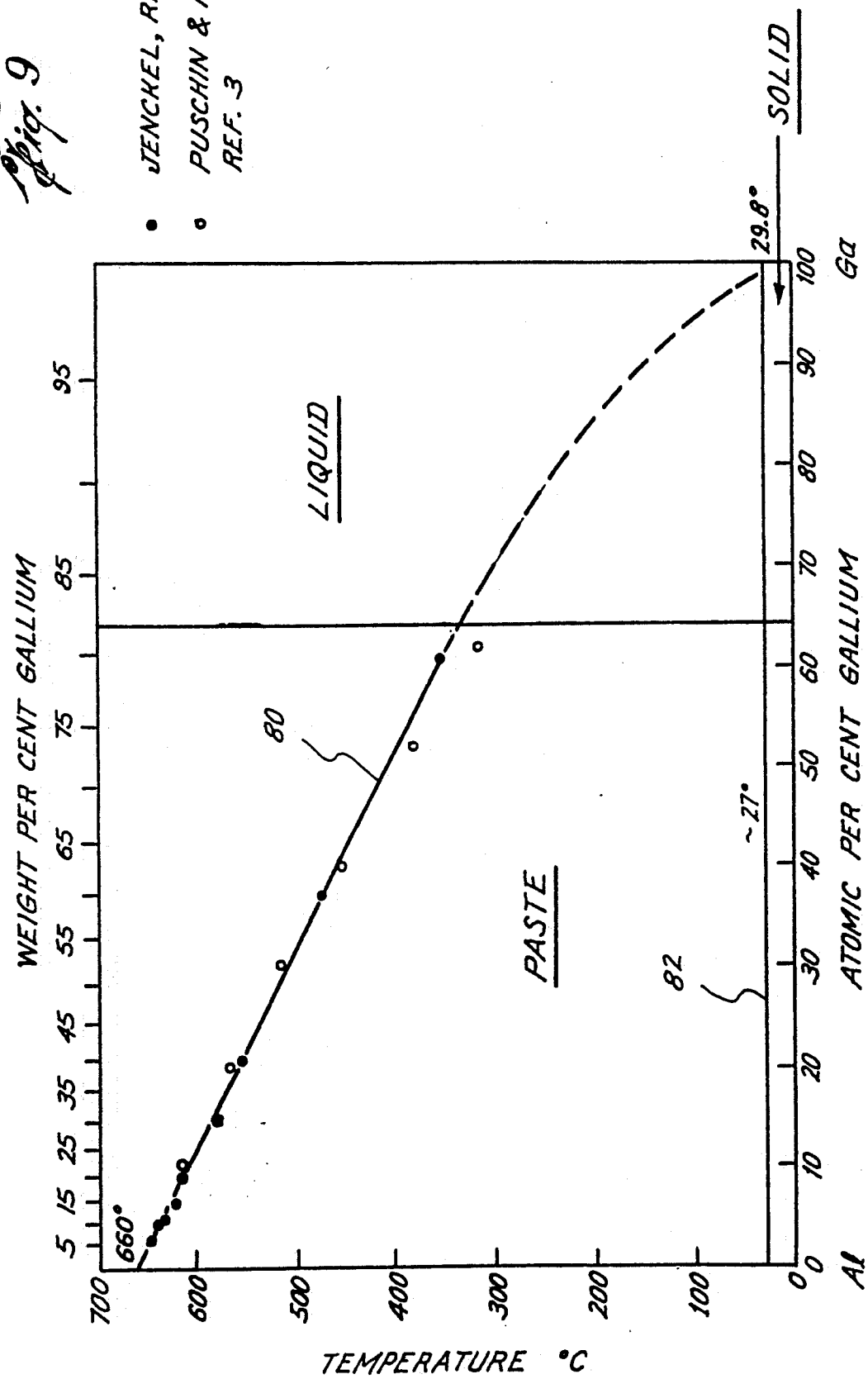

LIQUID METAL PASTE FOR THERMAL AND ELECTRICAL CONNECTIONS

BACKGROUND OF THE INVENTION

The present invention is directed to a non-solidifying paste consisting of an equilibrium mixture of a liquid metal and particulate solid constituents. The present paste is thermally and electrically conductive and can be used for cooling electronics and/or making electrical connections.

The paste has many advantages over liquid metals or solders for use as a thermal interface material. As compared to liquid metals, the present paste is more viscous than liquid metals and provides containment to impulsive loading. In many cases it has higher thermal and electrical conductivity and eliminates gross dewetting from certain materials, as may be seen with liquid metals. As compared with solids, the paste is perfectly compliant in the plane parallel to the joined surfaces. This results in the elimination of thermal stress on the joined surfaces, unlike most bonds made with solid materials. Further, the paste is compliant in the direction perpendicular to the interface for height variablility tolerant assembly; however, no temperature is required to cure or harden the material, and more importantly the connection is detachable.

The cooling of electronic components in ground based and avionics systems is becoming more challenging. As the desire for greater processing speed and compactness increases, cooling systems for these applications must have an efficient, low stress, thermal interconnect between the power dissipating element and the final heat sink in the package. This thermal interconnection is the limiting factor in many cooling systems in which heat flows through the back of a chip to a heat exchanger above the substrate. Being a common problem, many techniques have been used. Most can be classified as one of either a solid metallurgical bond, a microstructural or structural contact, a demountable liquid or grease interface, or a combination of these types. Examples of materials used for a solid metallurgical bond are solders, Au-Si eutectic bonds or silver loaded epoxies. A typical thermal resistance across an interface formed using these materials is approximately 0.2 K-cm$^2$/W depending on the void fraction of the joint and the exact material used. While this thermal performance is acceptable for many applications, this technique is structurally unappealing except for low cost packages with single solid state devices which may be thrown away if a device fails. For multi-chip modules such a solution is almost impossible to engineer and technically unreliable unless special provisions are included in the design to allow rework and repair of the module and to account for the unavoidable positional tolerances between the backside surfaces of the different chips to be cooled. In addition, these materials require the bond to be formed at an elevated temperature which even further complicates the assembly.

An example of a microstructure interface intended to provide a low impedance thermal interface between solid state device and a cold plate or the like is given in U.S. Pat. No. 4,498,530. This example is similar to many other examples which use a microstructure to increase the area of heat transfer across the interface in an attempt to lower its thermal impedance while providing compliance. While these solutions can achieve the vertical compliance needed from a manufacturing standpoint and the compliance parallel to the surface of the device, their thermal performance is questionable since the complicated structure usually has a long thermal path which offsets the advantage of increasing the apparent area of the interface.

Greases and other grease-like materials have been used for making compliant thermal interconnects. Two examples are Dow Corning Heat Sink Compound DC-340 and the material described in U.S. Pat. No. 4,299,715. These materials have the desirable characteristic of being fluid enough to fill microscopic voids that are present when two macroscopically smooth surfaces are brought into contact. A major object of such materials is to be able to improve the heat conduction across such a joint by filling these voids. Despite the low thermal conductivity of greases (e.g. 0.01 W/cm K) in comparison to metals, these solutions are attractive because the void area at such an interface is usually greater than 90% of the apparent contact area. A disadvantage of these materials is that they are difficult to handle in production. Further, when these grease-like materials are used with packages requiring long term reliability, difficulty often arises with containing the materials within the interface and maintaining the materials in place during operation.

Liquid metal interfaces retain the desirable characteristics of a thermal grease interface and have a much lower thermal impedance. The thermal conductivity of gallium, for instance, is approximately 100 times greater than that of a thermal grease. Thus, thermal impedances below 0.05 K-cm$^2$/W are achievable. None of the other techniques or materials can approach impedances this low. This is the major attraction of liquid metal based interfaces. However, because liquid metals are electrically conductive, handling and containment within the interface between the hot chip and the cooling structure is even more critical than with thermal greases. Liquid metals tend to dissolve and/or amalgamate with many of the common metals used to fabricate printed wiring boards and integrated circuits. Thus, incorrectly used, the liquid metal may actually destroy the devices it is being used to cool. Moreover, initially wetting as well as maintaining wetting of the surfaces to be joined is critical to the thermal performance and containment of a liquid. Another advantage of liquid metal based materials is their ability to wet ceramics such as alumina and aluminum nitride.

Similarly, various methods and materials have been used to make electrical connections between first and second electrical components. Again, the prior art connections did not provide all of the advantages of not only low electrical resistance, but also a conformable, compliant and removable connection which is secure enough to withstand the environmental conditions to which the components are subjected.

SUMMARY

One object of the present invention is to provide a thermally and electrically conductive non-solidifying paste, comprised of an equilibrium mixture of an electrically conductive liquid metal and particulate solid constituents, which is suitable for reliably and easily making low thermal impedance interfaces in electronic cooling systems and/or usable for making electrical interconnections between electrical components.

Another object of the present invention is the provision of a method of making a detachable and compliant thermally conductive connection between two surfaces by releasably connecting the two surfaces together and/or making a detachable and compliant electrical connection between first and second electrical components by releasably connecting a first electrical component to a second electrical component. In each case, a paste comprising an electrically conductive liquid metal and particulate solid constituents is used. The proportions of the mixture of liquid metal and particulate solid constituents is such that the mixture remains a paste for temperatures between the ultimate liquidus and the ultimate solidus lines of the phase diagram of the mixture.

Still a further object of the present invention is a paste in which the wetting of the particulate solid constituents by the liquid metal is enhanced by coating the particulate solid constituents with a material that will wet with the liquid metal such as nickel, silver, or antimony. Another method of enhancing the wetting of the particulate solid constituents by the liquid metal is by alloying a metal, such as nickel, silver, or antimony, to the liquid metal.

Another object of the present invention is a paste wherein the particulate solid constituents are not fully wetted by the liquid metal and may be fully or partially encapsulated by a gas, an oxide film, or a mixture of both.

Still a further object of the present invention is a paste wherein the mixture has a viscosity in the range of 20,000 to 200,000 centipoise.

Still a further object is a paste wherein the liquid metal and the particulate solid constituents do not produce a reaction compound and the particulate solid constituents are soluble in the liquid metal to some extent.

Another object of the present invention is a paste which can be used as a solder with a controlled TCE and elastic modulii for cryogenic and low temperature (below 5° C. to 30° C.) applications.

Yet a further object of the present invention is a paste wherein the liquid metal and particulate solid constituents produce a reaction compound layer on the particulate solid constituents and the particulate solid constituents are soluble in the liquid metal to some extent.

Still a further object of the present invention is the provision of a non-solidifying compliant, conformable, and thermally and electrically conductive paste comprised of an electrically conductive liquid metal and particulate solid constituents. The proportions of the equilibrium mixture of liquid metal and particulate solid constituents, in the range of temperatures encountered while connecting two surfaces lies between the ultimate liquidus and the ultimate solidus of the phase diagram of the mixture, and a third material is added to the mixture to enhance the wetting of the mixture. The third material may coat the particulate solid constituents and wet with the liquid metal and/or the material may alloy with the liquid metal. Preferably, the mixture has a viscosity in the range of 20,000–200,000 centipoise, the liquid metal and particulate solid constituents do not produce a reaction compound, and the particulate solid constituents are soluble in the liquid metal to some extent.

Still a further object of the present invention is wherein the thickness of the paste used for a thermal connection is not less than 1 ml and is no more than approximately 1 to 80 mils.

A still further object of the present invention is wherein the paste can be applied at room temperature.

Yet a further object of the present invention is the ability to control the paste's thermal and electrical conductivities and the paste's viscosity by means of the particle loading and the powder or powders chosen.

A still further object of the present invention is wherein the paste is constrained to remain in the positions required for thermal and electrical connections due to the physical nature of the paste.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIG. 9 is a phase diagram of the mixture of gallium and aluminum versus temperature.

DESCRIPTION OF THE PREFERRED EMBODIMENT

While the paste of the present invention and its method of making are directed to a detachable and compliant thermal connection between two surfaces and/or providing a detachable and compliant electrical connection between first and second electrical components, the present invention will be described with specific preferred embodiments set forth for purposes of illustration only.

Figure 1:
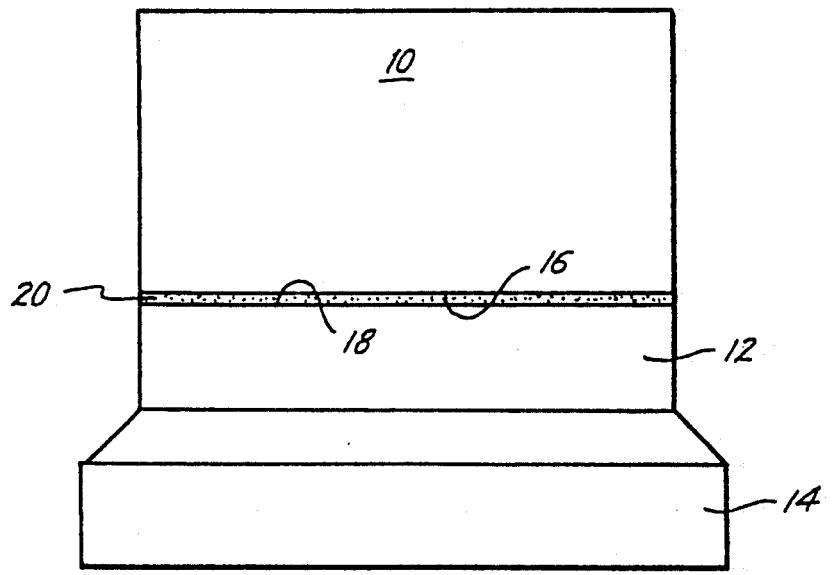
FIG. 1 is a side view of the connection of a heat exchanger to an electrical component.

Referring now to the drawings and particularly to FIG. 1, the reference numeral 10 generally indicates any suitable type of heat exchanger, which is to be attached to an electronic component such as an integrated circuit chip package 12 which, in turn, is supported from a substrate 14. In order to cool the electronic component 12 by the heat exchanger 10, a surface 16 of the heat exchanger 10 is attached or connected to a surface 18 of the component 12. This attachment is shown by means of surface tension between connection 20 and surfaces 16 and 18; however, other structural support could be used which would minimize the role of surface tension. Obviously, the connection 20 should have a low thermal resistance to heat flow. However, in addition to this characteristic, it is advantageous that the connection 20 allow conformity between the surfaces 16 and 18 to insure a good transfer of heat and reliable manufacturability. Another advantageous characteristic is that the connection 20 should be compliant as compliance aids assembly of the interconnection of the surfaces 16 and 18, as well as any other surfaces (not shown) due to the accommodation of the engineering tolerances of their positions relative to each other. Being fluid above its melting point, connection 20 should also alleviate stress problems imposed by differential thermal expansion of the exchanger 10 and component 12 during use, since the thermal expansions will be absorbed in the connection 20 and thereby not transmitted to the other parts forming the joint. Another desirable characteristic is that the connection 20 should be releasable thereby allowing disconnection of the various components and allowing for rework and reconnection.

The present invention is directed to releasably connecting the surface 16 to the surface 18 with a thermally conductive and compliant paste of an equilibrium mixture of liquid metal with particulate solid constituents, such as particles or fibers. The paste can be made by mechanically mixing an electrically conductive liquid metal, such a gallium, with a powder, such as aluminum. The paste can also be made from certain combinations of particulate solid constituents and liquid metals by dissolving a solid, such as a metal in any of sheet, wire or powder form, into the liquid metal at a temperature above the ultimate liquidus of the system and then precipitating out solids upon cooling the system down to a temperature in its operational range. Examples of suitable liquid metals and particulate solid constituents (i.e. fillers) will be more fully discussed in the examples given hereafter. The particulate solid constituents can be other metals, non-metals, or combinations thereof. The materials added to the liquid metal as well as their compositions are selected such that a paste is formed instead of a permanent solid. That is, an equilibrium mixture of liquid metal and particulate solid constituents is required to assure that the paste remains non-solidified between the ultimate liquidus and the ultimate solidus of the phase diagram of the mixture when the temperature during connection of the paste to the surfaces (e.g., room temperature) is held constant. This is in contrast to an amalgam, which eventually hardens into a solid bond even if a constant temperature is maintained. An advantage of the present invention paste is that it can be produced and then applied at room temperature, for example by screen printing, to join the two surfaces 16 and 18. This method avoids exposing the electronic component 12 and the substrate 14 to an elevated temperature cure that is required when a permanent bond is formed.

Importantly, use of the present paste in the interconnection 20 allows removal of the heat exchanger 10 from the chip package 12 allowing for rework, while providing a low thermal resistance (i.e. less than 0.1 K-cm$^2$/W) across the connection 20.

In addition, the use of the paste as the connection 20 will provide compliance parallel to the surfaces 16 and 18. This will minimize the thermal stress on surfaces 16 and 18. This characteristic will allow thinner interfaces and larger chips to be reliably attached to various surfaces than can be accomplished with solid bonds or other metallurgical bonds while still meeting the same fatigue-life requirements. Thinner interfaces can be particularly advantageous for single chip packages such as pin grid arrays (PGA). In addition, for multi-chip modules it is estimated that the surfaces 16 and 18 may be held together by the paste of the present invention with a thickness of approximately 1–80 mils, but not less than the maximum particle size. For other applications, however, a thicker interface can be used to provide more tolerant assembly yet still meet the thermal requirements due to the high conductivity of the paste.

Additionally, the paste should have a suitable viscosity, for example from 20,000 to 200,000 centipoise, to reliably maintain the connection 20 formed and which is also suitable for the method of applying the paste to the surfaces 16 and 18.

Figure 2:
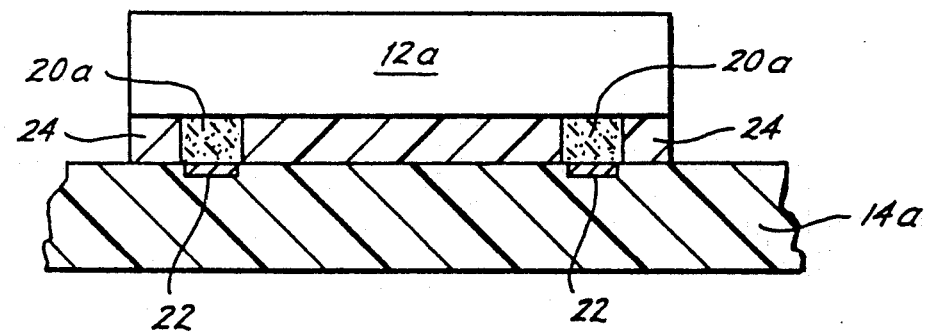
FIG. 2 is a side view partly in cross-section illustrating the connection of one electrical component to a second electrical component.

The paste of the present invention has other applications. As best seen in FIG. 2, the paste is used in making electrical connections between first and second electrical components because of its low electrical resistivity. The electrical resistivity of the paste should typically be lower than other alternative bonding materials such as solder.

Referring now to FIG. 2, a chip 12a is shown utilizing the paste interconnection 20a of the present invention to connect a first electronic component 12a to a second electronic component 14a such as a substrate having a plurality of conductors or traces 22. The interconnection 20a again has the advantages of being removable, compliant, thin, but with the desirable amount of strength or viscosity, as well as high electrical conductivity. If desired, an additional method of attachment such as an adhesive film 24 may be provided to additionally secure the component 12a to the substrate 14a, which may be any suitable adhesive such as a generic acrylic or epoxy. The adhesive film 24 also surrounds the paste interconnections 20a and prevents the paste 20a from migrating under acceleration loads.

Figure 3:
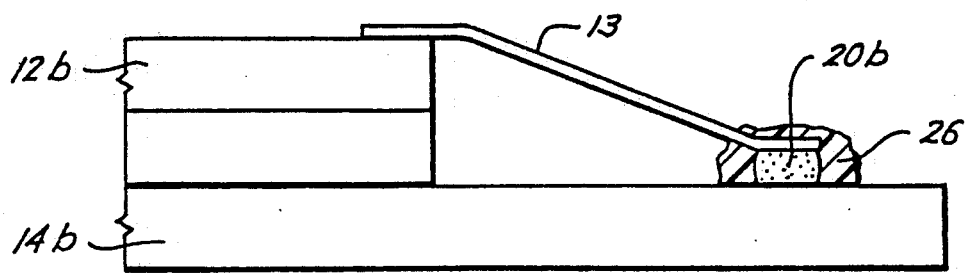
FIG. 3 is another embodiment of a method of making an electrical connection between first and second electrical components.

Referring now to FIG. 3, still a further embodiment of the use of the present invention illustrates another method of making an electrical connection between a first electrical component such as chip 12b and a second electrical component such as substrate 14b. In this embodiment, the paste connection 20b is used for an outer lead bond of a tape-automated-bonding (TAB) lead 13. Again, this connection provides the desirable characteristics of low electrical resistance, a removable bond, and a compliant connection for overcoming fatigue caused by thermal expansion or mechanical effects such as vibrations. Further, the use of a thin connection for further reducing electrical resistance, but with sufficient strength and surface tension to provide a secure connection. Again, if desired, an adhesive attachment such as an encapsulant 26 may be provided, such as silicon rubber, to additionally support the connection 20b, and prevent its migration, while still providing a connection which has the necessary compliance and is removable.

Figure 4:
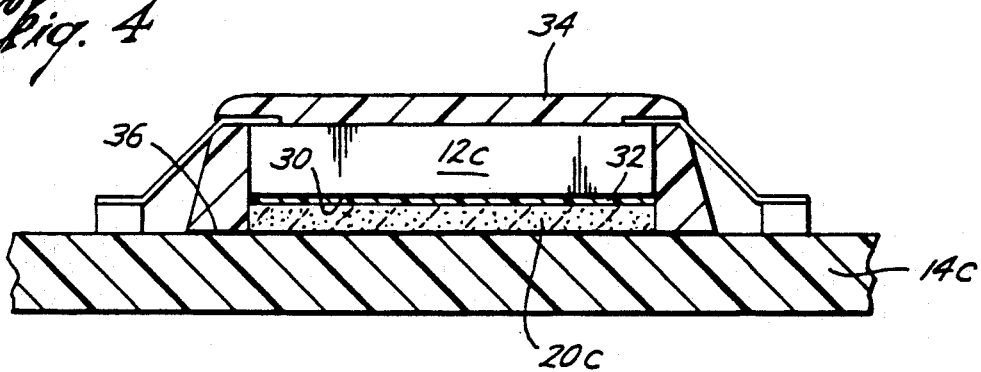
FIG. 4 is another embodiment of a method of making a connection between first and second electrical components.

With reference now to FIG. 4, another embodiment illustrates the use of the present invention to make an electrical and/or thermal connection between a first electrical component such as chip 12c and a second electrical component such as substrate 14c. In this embodiment the paste connection 20c is used as a die attach. If a non-electrically conductive thermal connection is desired, the bottom 30 of chip 12c can be coated with an insulative layer 32 such as nitride passivation or diamond film to assure that the bottom 30 of chip 12c is electrically isolated from substrate 14c since paste 20c is electrically conductive. Thereafter, an encapsulant 34 such as a polymeric coating is applied over chip 12c and adheres to chip 12c and the underlying substrate 14c around the periphery 36 of chip 12c. Encapsulant 34 provides mechanical support as well as containment of paste 20c.

Figure 6:
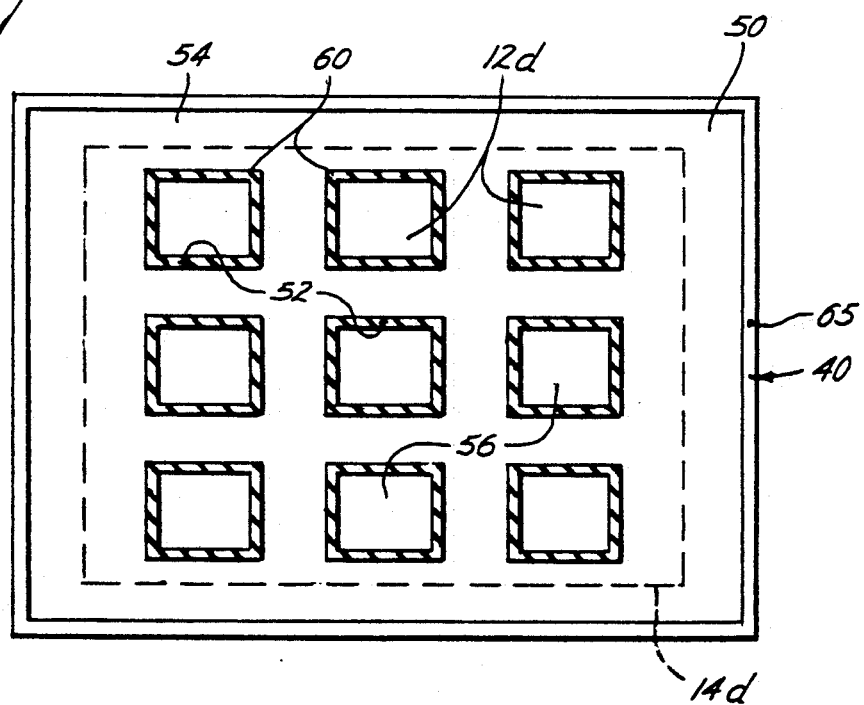
FIG. 6 is a top plan view to a reduced scale taken along line 6—6 of FIG. 5.
Figure 5:
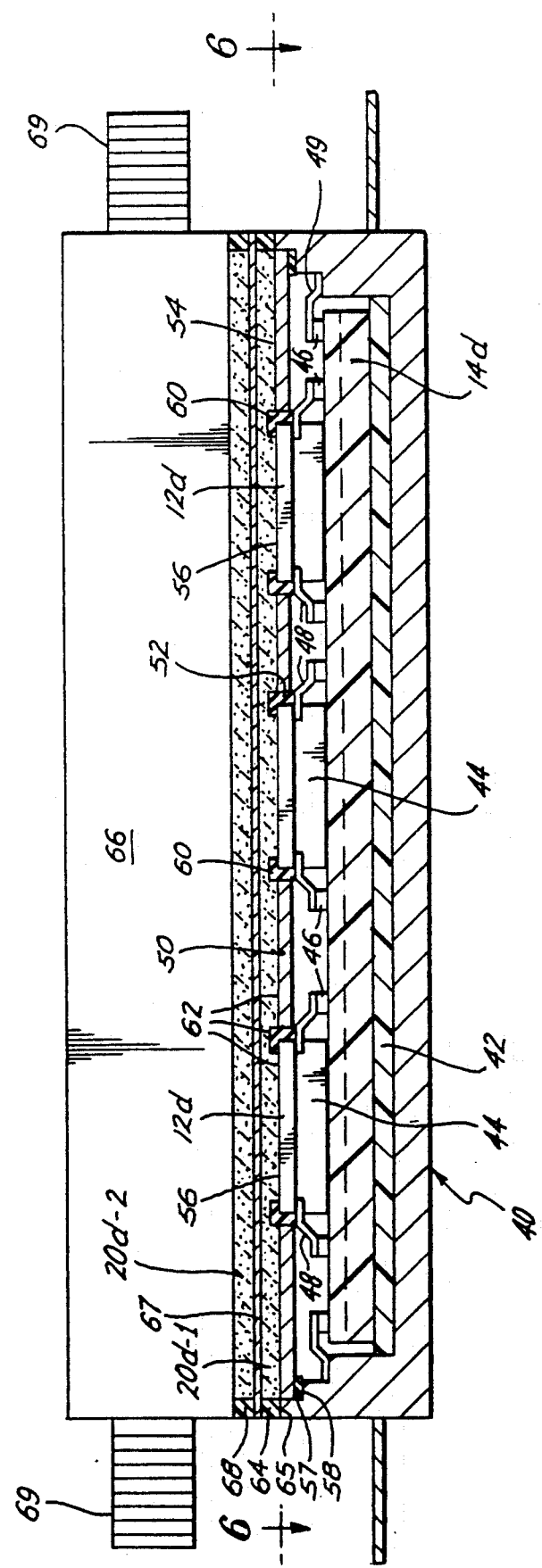
FIG. 5 is still another embodiment of a method of making a thermal connection between components.

Referring now to FIGS. 5 and 6, cross-sectional and top plan views, respectively, are shown of a multichip module package utilizing a liquid metal paste thermal interface to the semiconductor devices. Package 40 comprises substrate 14d connected to the package floor by epoxy 42. A plurality of optional support pads 44 and mandatory bonding pads 46 are disposed on substrate 14d. Chips 12d are mounted on support pads 44 and TAB leads 48 extending from chips 12d are bonded to bonding pads 46. In addition, wire bonds 49 are formed between package 40 and substrate 14d. A 20 mil thick support frame 50 has openings 52 formed to surround chips 12d. Openings 52 are aligned with chips 12d and then support frame 50 is lowered onto adhesive 57 on inner ledge 58 of package 40. As a result, chips 12d are closely positioned within openings 52 and the top 54 of support frame 50 is coplanar with the tops 56 of chips 12d. Thereafter, a removable sealant such as paraffin wax 60 is caulked into the space in openings 52 between support frame 50 and chips 12d. Wax 60 forms a seal between chips 12d and support frame 50. The combination of wax 60, support frame top 54 and chip tops 56 forms a sealed surface 62 that prevents any paste deposited thereon from migrating onto substrate 14d. A first restraint 64 such as epoxy, sticky tape or foil is placed on outer ledge 65 adjacent and co-planar with the periphery of support frame top 54 for containing a first paste 20d-1 and forming part of a sealable connection between a heat sink shown as monolithic cold plate 66 and package 40. A 5 mil layer of first paste 20d-1 is deposited on sealed surface 62 inside first restraint 64 and thus contacts chips 12d, and a thin sheet such as foil 67 having 1 mil thickness is deposited on first restraint 64 and first paste 20d-1. Likewise, a second restraint 68 identical to first restraint 64 is deposited on foil 67 directly above first restraint 64 and 5 mils of a second paste 20d-2 is deposited on foil 67 inside second restraint 68. Thereafter, cold plate 66 is deposited on second restraint 68 and second paste 20d-2. As a result, cold plate 66 is sealably connected to package 40. Cold plate 66 includes cooling ports 69 for circulating a heat removing fluid therethrough. Sealed surface 62 assures that while pastes 20d-1, 20d-2 and foil 67 provide enhanced thermal conductivity between chips 12d and cold plate 66, paste 20d-1 shall not inadvertently migrate beneath surface 62 and perhaps cause a short circuit on leads 48 or substrate 14d.

Sealed surface 62 and first paste 20d-1 also provide a hermetic seal for the underlying structure. As used herein, the term "hermetic" is defined as maintaining less than 5 ppm of water vapor in the cavity volume with a leak rate of less than $5e^{-8}$ atmcc/sec of helium for a packaging volume less than 0.01 cc as per Method 1014.9 in Mil-Standard 883 C. In other words, hermiticity specifies an initial water vapor content and the ingress rate of helium from a leak test as per Mil-Standard 883 C.

In addition, different properties between pastes 20d-1 and 20d-2 may be advantageous. For example, second paste 20d-2 may have the lower ultimate solidus temperature so that at certain temperatures only first paste 20d-1 solidifies. Or second paste 20d-2 may be easier to detach in order to minimize the stress placed on chips 12d in the event cold plate 66 is removed.

Of course a single layer of paste 20d (not shown) could be substituted for pastes 20d-1, 20d-2 and foil 67. That is, a single layer of paste 20d could be deposited inside first restraint 64 on sealed surface 62 and then cold plate 66 could be sealably mounted on restraint 64 and contacted to paste 20d. As with the double paste embodiment, single paste layer 20d would enhance the thermal conductivity between chips 12d and cold plate 66, and paste 20d in conjunction with sealed surface 62 would form a hermetic seal to the structure beneath surface 62.

There are alternative methods for applying the paste or pastes. For instance, before depositing paste 20d, cold plate 66 could be sealably mounted on restraint 64 and then paste 20d could be vacuum filled through ports (not shown) in restraint 64 and thereby sandwiched between cold plate 66 and sealed surface 62. The ports could then be sealed with epoxy. A similar procedure could be used for pastes 20d-1 and 20d-2 by vacuum filling through ports in restraints 64 and 68, respectively.

Figure 7:
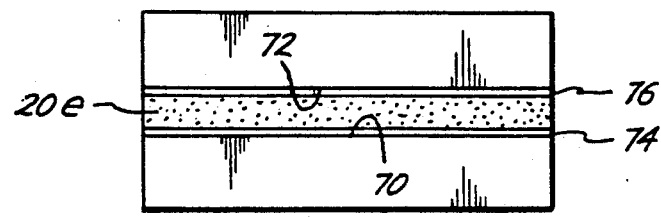
FIG. 7 is a side view illustrating the connection of coated surfaces.

With reference now to FIG. 7, there is seen a side view of coated surfaces connected by the present invention paste. In the event, for instance, the liquid metal of paste 20e contains gallium then aluminum surface 70 and copper surface 72 requires surface coatings or preparations to allow a reliable interface to be maintained. In the case of aluminum surface 70, the aluminum is embrittled by gallium. Gallium at a bare aluminum surface tends to migrate along the grain boundries of the aluminum. Within a short time a vast majority of the gallium may migrate from the interface which obviously degrades the thermal performance of the paste. As for copper surface 72, copper and gallium react to form various compounds. Over time the liquid gallium at the interface may be consumed by these reactions. In order to avoid these problems, surfaces 70 and 72 are passivated by coating with an appropriate material such as by electroplating, chemical vapor deposition, explosive forming, roll bonding, and so on. A protective coating 74 can be provided on aluminum surface 70 by anodization, thermal spray of alumina or aluminum nitride, nickel plating, nickel plating and subsequent heat treatment to form nickel-aluminum compounds, chemical vapor deposition of tungsten, and cladding with tungsten, tantalum or molybdenum. Protective coating 74 can also be provided by coating surface 70 with a metal that can yield a refractory oxide and then oxidizing the metal to form a continuous refractory oxide layer on surface 70. Suitable metals that can form a refractory oxide include nickel, chromium, titanium, tantalum, yttrium, scandium, zirconium and niobium. Furthermore, an electrically resistive protective coating 74 such as alumina, aluminum nitride or a sufficiently thick continuous refractory oxide layer can be used to prevent the paste from electrically connecting the surfaces. Likewise, copper surface 72 can be coated with a protective coating 76 in the same manner aluminum surface 70 is coated with coating 74 except that coating 76 can not be anodized. One particularly preferred approach is to coat the surfaces 70 and 72 with the same material that is the particulate solid constituent of the paste, such as tungsten, in order to inhibit dissolution of the protective coating into the paste. Although for most coatings the dissolution is slow or the coating inhibits diffusion into the bulk material. It is also noted that protective coating 74 can be used to protect surfaces exposed to liquid gallium alone.

The non-solidifying liquid metal with particulate solid constituents provides a separable, reliable connection to provide a low thermal resistance as well as a low electrical resistance. The paste-like consistency coupled with metallic properties provides a connection with advantageous thermal conductivity and electrical conductivity comparable to or greater than a liquid metal or solid metallurgical bonds but is more easily contained than liquid metals and forms a separable bond unlike solid metallurgical bonds.

The advantageous properties and results are illustrated in the following examples:

EXAMPLES

Figure 8:
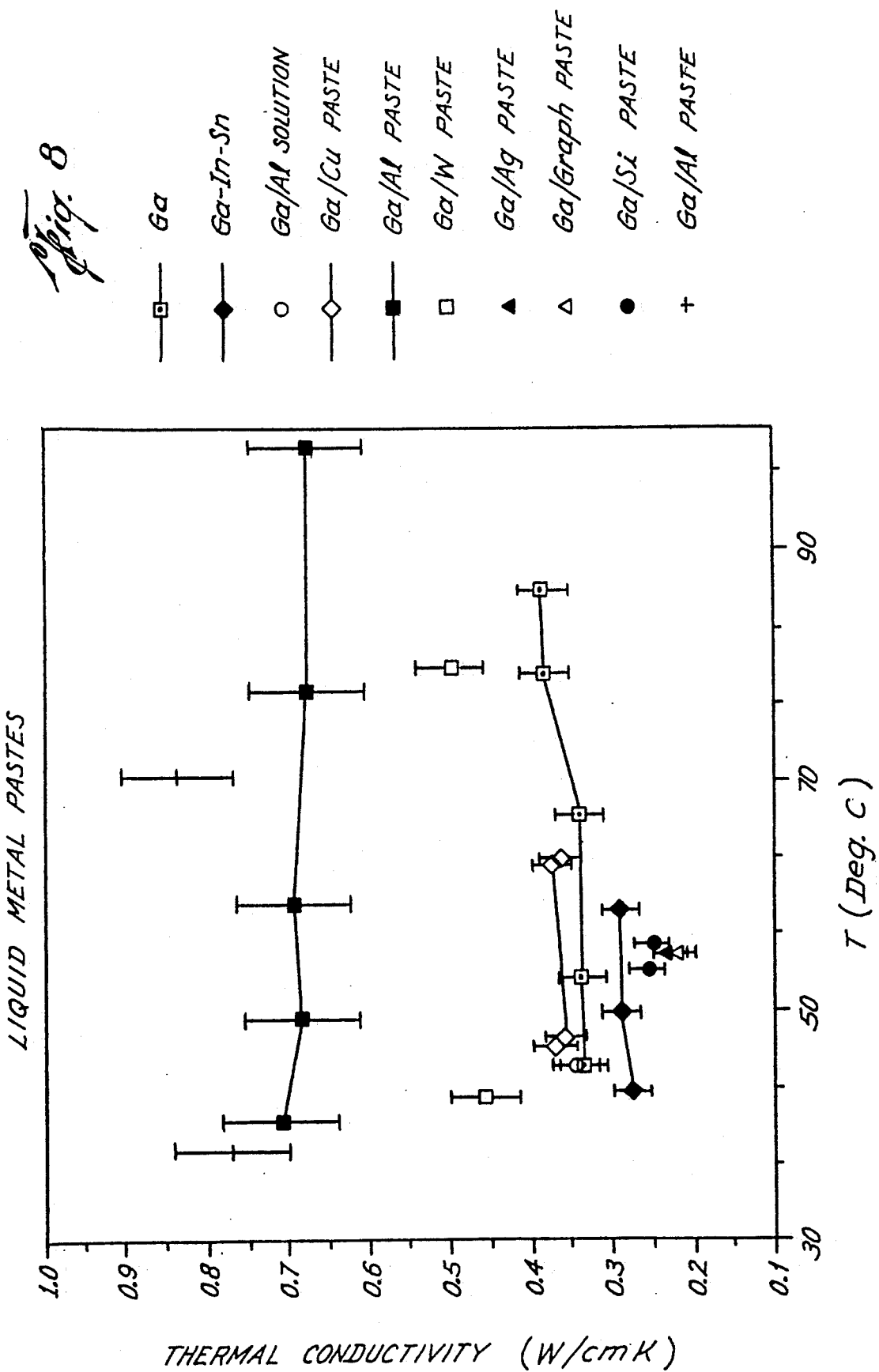
FIG. 8 is a graph of thermal conductivity versus temperature of the results of various tests performed.

Various liquids and pastes were prepared to ensure that the paste could be made and to test the resultant thermal conductivity of the mixtures. All the pastes tested were much more viscous than liquid gallium alone. Of the pastes tested only the Ga/Si powder system exhibited difficulty in making the paste. Thermal conductivity measurements were made to determine how the addition of solids affected this property and to determine how to increase the thermal conductivity. The thermal conductivity results are plotted in the graph of FIG. 8. The absolute uncertainty for each measurement is also depicted. This probablistic error is useful when comparing data determined by using different measurement techniques or by different investigators. When comparing the measured results, the uncertainty of repeated trials is the valid uncertainty measure to consider. This ranged from 0.01 W/cm-K to 0.03 W/cm-K.

The tests that were run are as follows: Liquids:
1. Ga (99.9999% pure)
2. Ga-In-Sn (62.5%/21.5%/16% by weight)
3. Ga/Al solution (98.8%/1.20% by weight) Pastes:
4. Ga/Si (approx. 49.3%/50.6% by volume)
5. Ga/Cu (oxidized powder)
6. Ga/Al
7. Ga/Ag
8. Ga/C (labelled graphite)
9. Ga/W The compositions of the liquids in Tests 1-3 were determined by X-ray analysis. The paste of Tests 4-9 were constructed in an air environment by mechanically mixing the powder component with the liquid Ga. The exact composition is given for the mixture for the paste in Test 4. In the other tests, 5-9, the mixture included solids in the range of from 40-50% by volume. In all of the tests, 4-9, the size of the solids were less than 45 microns. Further, test 5 will form a permanent solid over time, i.e. an amalgam, so the system in test 5 is less useful for the applications described herein.

A difficulty in mixing known proportions is that a portion of the gallium tends to wet the container in which the paste is mixed. As a result, it cannot easily be removed from the container. Therefore, the approach was to load the gallium with the powder (about 40-50% powder by volume) until the mixture was quite viscous (20,000 to 200,000 centipoise). The viscosity is quite controllable and depends primarily on the particle loading and possibly the particle shape and history.

The liquid metals, tests 1-3, were tested as a control group to compare to the paste results and to indicate the change in thermal conductivity compared to the basis liquid metal. Referring to the graph in FIG. 8 the paste can be classified in two categories—those which increased the thermal conductivity and those that did not.

Certain compounds did not improve the thermal conductivity. There seems to be three possible causes:
1. Difficulty wetting the particle in the current method of making.
2. The formation of reaction compounds between the liquid metal and the powder.
3. The powder properties were below their expected value.

A method is not presently known to determine the properties of the powder particles if it is manufactured as a powder.

Test 4, Ga/Si, is an example of a paste that decreased the conductivity due to partial wetting or non-wetting. SEM photos revealed that we actually seemed to encapsulate the particle with a thin layer of air or air and an oxide film. This difficulty in wetting the particles stems from the $SiO_2$ naturally present on the silicon. In addition, a brown compound was also noted to form on the mixing spatula that prohibited the gallium from wetting it. This is assumed to be some oxide which forms in the Ga/Si/O system. For our purposes at this time, no effort was made to understand this compound further.

Test 8, Ga/C, is another example of partial wetting or non-wetting, or of the use of a low conductivity powder. Graphite has highly anisotropic thermal properties. It also has a high thermal conductivity (22 W/cm-K) parallel to hexagonal planes in the crystal structure and a low conductivity of 0.05 W/cm-K perpendicular to these planes. Amorphous carbon has a conductivity on the order of this lower value. Thus, either this directional dependence or the use of amorphous carbon could result in decrease in the conductivity. A potential method to advantageously use the anisotropy would be to use particles or fibers elongated in a favorable direction to provide preferential conduction parallel or perpendicular to the interface.

Test 5, Ga/Cu, is an example of a paste that caused a formation of reaction compounds between the liquid metal and the powder and resulted in a solid amalgam layer around each particle. This amalgam has low conductivity compared to copper. Thus, it lowers the effective conductivity of the added powder and the mixture.

Test 7, Ga/Ag, is a clear example of the formation of reaction compounds negating possible conductivity improvements.

As indicated by a phase diagram, this mixture forms secondary solid phases in the temperature regions of interest.

The two systems which did show a measurable improvement were Ga/Al, test 6, and Ga/W, test 9. The desirable characteristics of these systems are that no reaction compounds are formed and the powder is soluble in the liquid metal to a certain extent, which enhances wetting. The Ga/Al phase diagram, FIG. 9, shows that Al is soluble on the order of 3 wt. % at the temperature range of 20 to 150 degrees celcius. The Ga/W phase diagram is less well known; however, it is believed that W is soluble in Ga but to a lesser extent than Al.

Both of the powders form oxides on the surfaces; however, the Ga undermines the surface oxides since the dissolution of the element into the melt is more energetically favored than formation of a complex oxide involving Ga. The mechanism for this process is probably via cracks in the oxide layer or the relative thinness of this layer.

While the tests above indicate that several of the compounds such as Ga/Al and Ga/W have superior thermal conductivity, all of the pastes that remain in the paste state, that is, tests 4 and 6-9 are suitable for making a detachable thermal conductive connection or a detachable electrical connection because of their other advantageous features of being removable, conformable, compliant, enhanced containment, and easier to apply. Therefore, it is concluded that a non-solidifying paste could be prepared out of various combinations of a liquid metal and particulate solid constituents such as the following:

| Liquid Metals (Melting Point) | Powders |
|---|---|
| Gallium (30° C.) | Alumina |
| Indium (259° C.) | Aluminum |
| Gallium/Tin (16° C.) | Aluminum Nitride |
| Gallium/Indium (15° C.) | Antimony |
| Gallium/Indium/Tin (5° C.) | Boron Nitride |
| Other Combinations with Mercury, Cadium, and Bismuth | Chromium |
| | Cobalt |
| | Cotton Fibers |
| Mercury (−39° C.) | Diamond |
| | Germanium |
| | Glass Beads |
| | Gold |
| | Graphite |
| | Iron |
| | Lead |
| | Magnesium |
| | Manganese |
| | Molybdenum |
| | Platinum |
| | Silicon |
| | Silicon Carbide |
| | Silver |
| | Tantalum |
| | Thallium |
| | Tin |
| | Titanium |
| | Tungsten |
| | Vanadium |
| | Zinc |

Of course the list is not exhaustive. Many other metal powder alloys are suitable, and different powders may be used for different reasons. However, not every combination of the listed liquid metals and powders would be suitable for the present invention. Particularly preferred pastes comprise gallium as the liquid metal, with either aluminum or tungsten as the particulate solid constituents comprising 30% to 60% loading by volume of the paste.

In determining what is the proper proportion of the mixture of liquid metal and particulate solid constituents, this determination is made from the phase diagram of the mixture (if it is known) in the range of temperatures to be encountered by the paste during the connection. If the phase diagram of the mixture is not known it can be determined empirically by experimentation. In either case the proportions of the mixture must lie between the ultimate liquidus and the ultimate solidus of the phase diagram of the mixture. That is, referring now to FIG. 9 in the example of the mixture of Al-Ga, the line 80 separates the liquid phase from the paste phase and the line 82 separates the paste phase from the solid phase. Therefore, any of the mixtures of Al and Ga between the lines 80 and 82 at the temperatures involved will remain a paste and be suitable for the applications herein discussed.

Another suitable definition of a conductive paste is one in which a solid is combined with a liquid to create a two phase mixture in which the constituents remain as a liquid and a solid over the range of temperatures encountered in which the range is a function of the specific composition of the constituents.

As discussed in connection with certain of the tests, there was difficulty in wetting the solid particles with the liquid metal. Test 4, Ga/Si, is an example of a difficult mixture to wett. This wetting may be improved by coating the solid constituents with a material that will wet with the liquid metal. For example, coating Si particles or powders with Ni will enable the particles to be better wetted. Other suitable coating materials include silver and antimony.

Another way of enhancing the wetting of the solid constituents by the liquid metal is by deliberately alloying a material to the liquid metal. For example, low levels of Ni alloyed to Ga will greatly enhance direct wetting to $Al_2O_3$ and Si. Other suitable alloying materials include silver and antimony.

Still a further way of creating a liquid metal paste in which the particles or fibers of the solid constituents are not wetted by the liquid metal is to encapsulate the particles or fibers by the liquid metal present-trapping a gas pocket, for instance of air, around each particle or fiber, which acts as an emulsifant to create the liquid metal paste.

It was also noted from the tests that a more satisfactory paste is formed in which the liquid metals and particulate solid constituents solids do not produce a reaction compound. The most satisfactory material is one in which the solids are soluble in the liquid metal to some extent without a reaction compound.

Additionally, the paste can contain a particulate solid constituent, such as particles or fibers, which are oriented parallel to the plane of an electronic component in contact with the paste in order to enhance the thermal spreading capability of the paste. Suitable fibers include graphite, tungsten, or silicon. Woven meshes of fibers can also be used.

Additional solids such as copper particles can also be added to enhance the thermal and/or electrical conductivity of the paste.

It should also be understood that the while the present invention paste remains non-solidified as long as the temperature of the paste remains above the ultimate solidus of the phase diagram of the mixture, if desired the paste can be hardened into a solid bond by decreasing the temperature of the paste below the ultimate solidus. Furthermore, the ability of the paste to wet various materials such as alumina and aluminum nitride results in adequate adhesion for solid bonds at low temperatures. Preferably, for ease of assembly, the liquid metal and particulate solid constituents are selected so that the paste will have to be cooled below room temperature before it solidifies and hardens. If necessary, the ultimate solidus of the paste can be decreased by alloying the liquid metal to reduce the melting point of the liquid metal. Gallium alloys, for instance, have melting points typically in the range of 5° C. to 30° C. and thus provide both a non-solidified paste at room temperature and a hardened solder in low temperature (below 5° C. to 30° C.) and in cryogenic environments. If the present invention paste is cooled below the ultimate solidus and hardened into a solid bond, by subsequently raising the temperature of the paste above the ultimate solidus the paste will soften and once again provide a compliant, detachable non-solidified connection between the surfaces.

Solids can also be added to the paste so that when the paste is cooled below the temperature of the ultimate solidus the thermal coefficient of expansion (TCE) of the hardened paste is matched or at least brought closer to the TCE of at least one of the surfaces in contact with the paste. For instance, the TCE of a paste with gallium (20 ppm/° C.) as the liquid metal can be substantially matched to the TCE of a silicon surface (3–4 ppm/° C.) by adding a solid filler such alumina (5–7 ppm/° C.), aluminum nitride (4–5 ppm/° C.) or diamond (0.8–1.0 ppm/° C.) to the paste. Additional solids can also lower the elastic modulii of the hardened paste to reduce the stress placed on either of the contacted surfaces.

The present invention, therefore, is well adapted to carry out the objects and attain the ends and advantages mentioned as well as others inherent therein. While presently preferred embodiments of the invention have been given for the purpose of disclosure, numerous changes in the detail of construction, arrangement of parts, steps of the process and composition of the paste, will be readily apparent to those skilled in the art and which are encompassed within the spirit of the invention and the scope of the appended claims.

What is claimed is:

1. A method of making an electrically conductive detachable connection between two surfaces, comprising:
releasably connecting the two surfaces together with a non-solidified paste comprised of an equilibrium mixture of an electrically conductive liquid metal and particulate solid constituents, wherein at the temperature of the paste during connection the proportions of liquid metal and particulate solid constituents remain between the ultimate liquidus and the ultimate solidus of the phase diagram of the mixture and the paste remains non-solidified.

2. The method of claim 1 wherein the liquid metal is selected from the group consisting of gallium and mercury.

3. The method of claim 1 wherein the liquid metal is a gallium alloy.

4. The method of claim 3 wherein the gallium alloy further comprises a material selected from the group consisting of bismuth, cadmium, and zinc.

5. The method of claim 1, further comprising alloying a material to the liquid metal in order to enhance the wetting of the particulate solid constituents by the liquid metal.

6. The method of claim 5 wherein the material is selected from the group consisting of nickel, silver, and antimony.

7. The method of claim 1, further comprising alloying a material to the liquid metal in order to lower the melting point of the liquid metal.

8. The method of claim 1 wherein the particulate solid constituents are a metal alloy powder.

9. The method of claim 1 wherein the particulate solid constituents are selected from the group consisting of alumina, aluminum, aluminum nitride, antimony, boron nitride, cobalt, chromium, cotton fibers, diamond, germanium, glass beads, gold, graphite, iron, lead, magnesium, manganese, molybdenum, platinum, silicon, silicon carbide, silver, tantalum, thallium, tin, titanium, tungsten, vanadium, and zinc.

10. The method of claim 1 wherein the particulate solid constituents are wet with the liquid metal but do not form reaction compounds therewith.

11. The method of claim 1 wherein the particulate solid constituents are wet with the liquid metal but do not dissolve therein.

12. The method of claim 1 wherein the particulate solid constituents are elongate and have a longitudinal axis oriented parallel to the plane of at least one of the surfaces in contact with the paste in order to enhance the thermal spreading capability of the paste.

13. The method of claim 1 wherein the particulate solid constituents are coated with a material that will wet with the liquid metal.

14. The method of claim 13 wherein the material is selected from the group consisting of nickel, silver, and antimony.

15. The method of claim 1 wherein the particulate solid constituents are encapsulated by a gas entrapped around each particle during the mixing with the liquid metal to create the paste.

16. The method of claim 1 wherein the particulate solid constituents are at least partially soluble in the liquid metal.

17. The method of claim 1 wherein the liquid metal and the particulate solid constituents do not produce a reaction compound and the particulate solid constituents are soluble in the liquid metal.

18. The method of claim 1 wherein the liquid metal and particulate solid constituents react to form a compound layer on the particulate solid constituents.

19. The method of claim 1 wherein the liquid metal is gallium and the particulate solid constituents are aluminum.

20. The method of claim 19 wherein the aluminum comprises 30% to 60% loading by volume of the paste.

21. The method of claim 1 wherein the liquid metal is gallium and the particulate solid constituents are tungsten.

22. The method of claim 21 wherein the tungsten comprises 30% to 60% loading by volume of the paste.

23. The method of claim 1 wherein the mixture has a viscosity in the range of 20,000 to 200,000 centipoise.

24. The method of claim 1 wherein the thickness of the paste connection is approximately 1–80 mils.

25. The method of claim 1 wherein the particulate solid constituents enhance the electrical conductivity of the paste.

26. The method of claim 1 wherein the particulate solid constituents enhance the thermal conductivity of the paste.

27. The method of claim 1 wherein the particulate solid constituents enhance the electrical and thermal conductivity of the paste.

28. The method of claim 1, further comprising adding additional solids to the paste to enhance the thermal conductivity of the paste.

29. The method of claim 28 wherein the thermal resistance of the paste is less than 0.1 K-cm$^2$/W.

30. The method of claim 1, further comprising adding additional solids to the paste to enhance the electrical conductivity of the paste.

31. The method of claim 1, further comprising, after said releasably connecting step cooling the paste below the temperature of the ultimate solidus, thereby hardening the paste and providing a solid bond between the surfaces.

32. The method of claim 31, further comprising alloying the liquid metal before hardening the paste to decrease the temperature of the ultimate soldius.

33. The method of claim 31 wherein the hardened paste is cooled to a temperature below 30° C.

34. The method of claim 33 wherein the hardened paste is cooled to a temperature below 5° C.

35. The method of claim 34 wherein the hardened paste also provides an adhesive bond between the surfaces.

36. The method of claim 31, further comprising heating the hardened paste above the temperature of the ultimate solidus, thereby providing a compliant detachable bond of non-solidified paste between the surfaces.

37. The method of claim 31, further comprising adding additional solids to the paste before hardening the paste to more closely match the thermal coefficient of expansion of the hardened paste with at least one of the surfaces.

38. The method of claim 31, further comprising adding additional solids to the paste before hardening the paste to lower the elastic modulii of the hardened paste and thereby reduce the stress on at least one of the surfaces.

39. The method of claim 1 wherein at least one surface is a protective coating on a third surface to prevent the third surface from exposure to the paste.

40. The method of claim 39 wherein the liquid metal is gallium.

41. The method of claim 39 wherein the protective coating is selected from the group consisting of alumina, aluminum nitride, nickel, tungsten, tantalum and molybdenum.

42. The method of claim 39 wherein the protective coating is a metal that can yield a refractory oxide, and further comprising oxidizing the metal to form a continuous refractory oxide layer on said at least one surface.

43. The method of claim 42 wherein the metal is selected from the group consisting of nickel, chromium, titanium, tantalum, yttrium, scandium, zirconium, and niobium.

44. The method of claim 39 wherein said third surface is copper.

45. The method of claim 39 wherein said third surface is aluminum.

46. The method of claim 45 wherein the protective coating is anodized aluminum.

47. The method of claim 39 wherein the protective coating is electrically resistive and prevents the paste from electrically connecting to the third surface.

48. The method of claim 39 wherein the surface releasably connected to the protective coating by the paste is a second protective coating on a fourth surface to prevent the fourth surface from exposure to the paste.

49. The method of claim 39 wherein the protective coating is the same material as the particulate solid constituents.

50. The method of claim 39 wherein the paste contains gallium, said third one surface contains copper or aluminum, and the protective coating maintains a reliable interface therebetween.

51. The method of claim 1 wherein one surface is an integrated circuit chip and the other surface is a substrate.

52. The method of claim 1 wherein one surface is the outer end of a tape automated bonding lead and the other surface is a bonding pad.

53. The method of claim 1 wherein one surface is an integrated circuit chip and the other surface is a heat sink.

54. The method of claim 1, wherein
one surface comprises a support frame with openings, a plurality integrated circuit chips closely positioned within the openings, and a removable sealant in the space in the openings between the chips and the support frame so as to form a sealed surface which prevents the paste deposited thereon from migrating therebeneath, and
the other surface is a heat sink.

55. The method of claim 54 wherein the sealed surface and the paste form a hermetic seal.

56. The method of claim 54, further comprising depositing a first paste on the sealed surface, a foil on the first paste, a second paste on the foil, and the heat sink on the second paste.

57. The method of claim 56 wherein the second paste is easier to detach than the first paste.

58. The method of claim 56 wherein the second paste has a lower ultimate solidus than the first paste, and further comprising, after said releasably connecting step and said depositing step, cooling the pastes so that the first paste solidifies but the second paste remains non-solidified.

* * * * *

UNITED STATES PATENT AND TRADEMARK OFFICE
CERTIFICATE OF CORRECTION

PATENT NO. : 5,170,930

DATED : December 15, 1992

INVENTOR(S) : DOLBEAR ET AL

It is certified that error appears in the above-identified patent and that said Letters Patent is hereby corrected as shown below:

Column 1, line 42, "Examples of materials..." begins a new paragraph.

Column 1, line 62, insert -- a -- before "solid state device".

Column 3, line 38, change "TCE" to -- thermal coefficient of expansion (TCE) --.

Column 5, line 22, change "a" to -- as --.

Column 6, line 44, change "the use of a thin connection" to -- a thin connection is used --.

Column 9, line 29, "Liquids" is on a separate line.

Column 9, line 32, "Pastes" is on a separate line.

UNITED STATES PATENT AND TRADEMARK OFFICE
CERTIFICATE OF CORRECTION

PATENT NO. : 5,170,930

DATED : December 15, 1992

INVENTOR(S) : DOLBEAR ET AL

It is certified that error appears in the above-identified patent and that said Letters Patent is hereby corrected as shown below:

Column 9, line 40, change "paste" to -- pastes --.

Column 11, line 14, change "Cadium" to -- Cadmium --.

Column 12, line 1, change "wett" to -- wet --.

Column 13, line 3, insert -- as -- after "such".

Column 14, line 61, change "soldius" to -- solidus --.

Column 16, line 7, delete "one".

Column 16, line 21, insert -- of -- after "a plurality".

Abstract, third line from bottom, change "in" to -- In --.

Abstract, second sentence from bottom, change "TCE" to -- thermal coefficient of expansion --.

Signed and Sealed this

Sixteenth Day of November, 1993

*Attest:*

BRUCE LEHMAN

*Attesting Officer*     *Commissioner of Patents and Trademarks*